United States Patent
Chang et al.

(10) Patent No.: US 8,395,195 B2
(45) Date of Patent: Mar. 12, 2013

(54) BOTTOM-NOTCHED SIGE FINFET FORMATION USING CONDENSATION

(75) Inventors: Chih-Hao Chang, Chu-Bei (TW); Jeffrey Junhao Xu, Jhubei (TW); Chien-Hsun Wang, Hsin-Chu (TW); Chih-Hsiang Chang, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 275 days.

(21) Appl. No.: 12/702,862

(22) Filed: Feb. 9, 2010

(65) Prior Publication Data

US 2011/0193178 A1    Aug. 11, 2011

(51) Int. Cl.
*H01L 27/085* (2006.01)
(52) U.S. Cl. ....................................... 257/255
(58) Field of Classification Search .................. 257/139, 257/208, 255, 347
See application file for complete search history.

(56) References Cited

U.S. PATENT DOCUMENTS

| | | | |
|---|---|---|---|
| 6,706,571 B1 | 3/2004 | Yu et al. | |
| 6,858,478 B2 | 2/2005 | Chau et al. | |
| 7,074,656 B2 * | 7/2006 | Yeo et al. | 438/157 |
| 7,190,050 B2 | 3/2007 | King et al. | |
| 7,247,887 B2 | 7/2007 | King et al. | |
| 7,265,008 B2 | 9/2007 | King et al. | |
| 7,508,031 B2 | 3/2009 | Liu et al. | |
| 7,528,465 B2 | 5/2009 | King et al. | |
| 7,605,449 B2 | 10/2009 | Liu et al. | |
| 7,635,632 B2 * | 12/2009 | Yeo et al. | 438/283 |
| 7,728,360 B2 * | 6/2010 | Chen et al. | 257/202 |
| 8,053,839 B2 * | 11/2011 | Yeo et al. | 257/347 |
| 2004/0099885 A1 * | 5/2004 | Yeo et al. | 257/208 |
| 2004/0217433 A1 * | 11/2004 | Yeo et al. | 257/412 |
| 2005/0153490 A1 | 7/2005 | Yoon et al. | |
| 2006/0220133 A1 * | 10/2006 | Yeo et al. | 257/347 |
| 2007/0120156 A1 | 5/2007 | Liu et al. | |
| 2007/0122953 A1 | 5/2007 | Liu et al. | |
| 2007/0122954 A1 | 5/2007 | Liu et al. | |
| 2007/0128782 A1 | 6/2007 | Liu et al. | |
| 2007/0132053 A1 | 6/2007 | King et al. | |
| 2008/0290470 A1 | 11/2008 | King et al. | |
| 2008/0296632 A1 | 12/2008 | Moroz et al. | |
| 2009/0181477 A1 | 7/2009 | King et al. | |
| 2009/0278196 A1 * | 11/2009 | Chang et al. | 257/328 |
| 2010/0176424 A1 * | 7/2010 | Yeo et al. | 257/255 |
| 2011/0227165 A1 * | 9/2011 | Basker et al. | 257/369 |

* cited by examiner

*Primary Examiner* — N Drew Richards
*Assistant Examiner* — Yu-Hsi D Sun
(74) *Attorney, Agent, or Firm* — Slater & Matsil, L.L.P.

(57) ABSTRACT

An integrated circuit structure includes a substrate and a germanium-containing semiconductor fin over the substrate. The germanium-containing semiconductor fin has an upper portion having a first width, and a neck region under the upper portion and having a second width smaller than the first width.

19 Claims, 10 Drawing Sheets

US 8,395,195 B2

BOTTOM-NOTCHED SIGE FINFET FORMATION USING CONDENSATION

TECHNICAL FIELD

This disclosure relates generally to semiconductor devices, and particularly to structures and formation methods of fin field-effect transistors (FinFETs) having silicon germanium fins.

BACKGROUND

Germanium is a commonly known semiconductor material. The electron mobility and hole mobility of germanium are greater than that of silicon, hence making germanium an excellent material in the formation of integrated circuits. However, in the past, silicon gained more popularity since its oxide (silicon oxide) is readily usable in the gate dielectric of metal-oxide-semiconductor (MOS) transistors. The gate dielectrics of the MOS transistors can be conveniently formed by thermal oxidation of silicon substrates. The oxides of germanium, on the other hand, are either soluble in water or may evaporate at temperatures above 425 C, and hence are not compatible with traditional IC processing.

With the use of high-k dielectric materials in the gate dielectrics of MOS transistors, the convenience provided by the silicon oxide is no longer a big advantage, and hence germanium is reexamined for use in integrated circuits. Recent studies of using germanium in Fin field-effect transistors (FinFETs) have been reported.

To reduce the leakage of MOS transistors and to increase the drive currents of germanium FinFETs, germanium-on-insulator (GOI) structures may be used. However, the price of GOI substrates (and strained GOI (SGOI) substrates) is significantly higher than that of silicon substrates and it is not practical for foundries to buy GOI substrates or SGOI substrates. Further, the technology and materials for processing silicon germanium, for example, selecting and controlling the chemicals for processing silicon germanium, are still being explored.

Conventionally, silicon germanium fins may also be formed by forming shallow trench isolation (STI) regions in the silicon substrate, recessing the portions of the silicon substrate between the STI regions to form recesses, epitaxially growing silicon germanium in the recesses, and then recessing the STI regions so that the epitaxially grown silicon germanium becomes silicon germanium fins. This approach, however, involves performing the chemical mechanical polish (CMP) on the silicon germanium, and hence also involves high manufacturing costs and the use of immature technology.

SUMMARY

In accordance with one aspect of the embodiment, an integrated circuit structure includes a substrate and a germanium-containing semiconductor fin over the substrate. The germanium-containing semiconductor fin has an upper portion having a first width, and a neck region under the upper portion and having a second width smaller than the first width.

Other embodiments are also disclosed.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative and do not limit the scope of the disclosure.

A novel fin field-effect transistor (FinFET) and the method for forming the same are provided. The variations of the embodiment are discussed. Throughout the various views and illustrative embodiments, like reference numbers are used to designate like elements.

Figure 1:
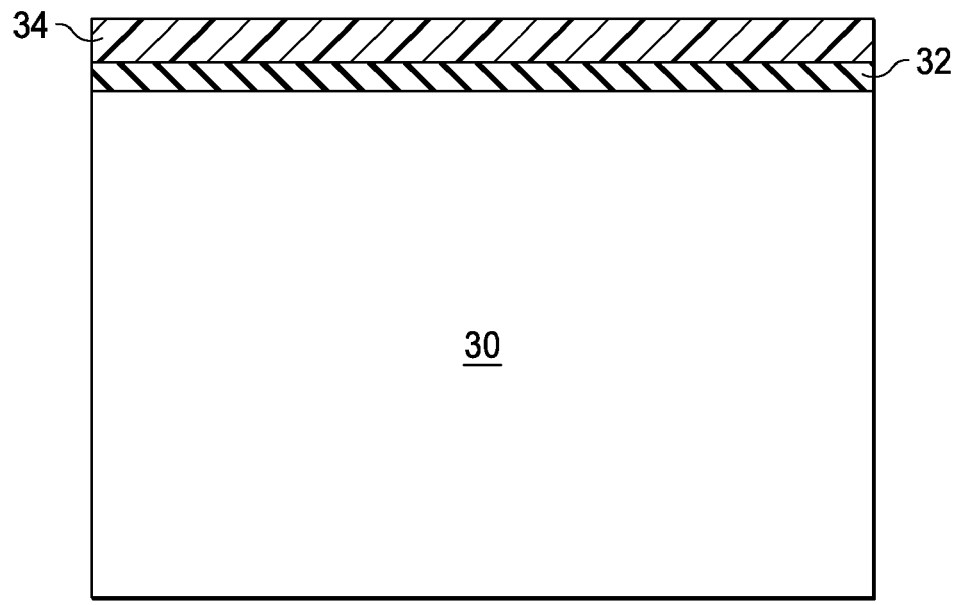
FIGS. 1-8, 9A, 9B, 10, 11A and 11B are cross-sectional views of intermediate stages in the manufacturing of a fin field-effect transistor (FinFET) in accordance with an embodiment.

Referring to FIG. 1, semiconductor substrate 30 is provided. In an embodiment, semiconductor substrate 30 is a bulk silicon substrate. Other commonly used materials, such as carbon, germanium, gallium, arsenic, nitrogen, indium, phosphorus, and the like, may also be included in semiconductor substrate 30. Semiconductor substrate 30 may be in the form of a single-crystal material or a compound material.

Pad layer 32 and mask layer 34 are formed on semiconductor substrate 30. Pad layer 32 is preferably a thin film formed through a thermal process and thus including silicon oxide. It is used to buffer semiconductor substrate 30 and mask layer 34 so that less stress is generated. Pad layer 32 may also act as an etch stop layer for etching mask layer 34. In an embodiment, mask layer 34 is formed of silicon nitride using low-pressure chemical vapor deposition (LPCVD). In other embodiments, mask layer 34 is formed by thermal nitridation of silicon, plasma enhanced chemical vapor deposition (PECVD), or plasma anodic nitridation using nitrogen-hydrogen. Mask layer 34 may have a thickness of about 60 nm to about 120 nm. It is noted, however, that the dimensions recited throughout the description are merely examples, and may change if the integrated circuits are formed using different technologies.

Figure 2:
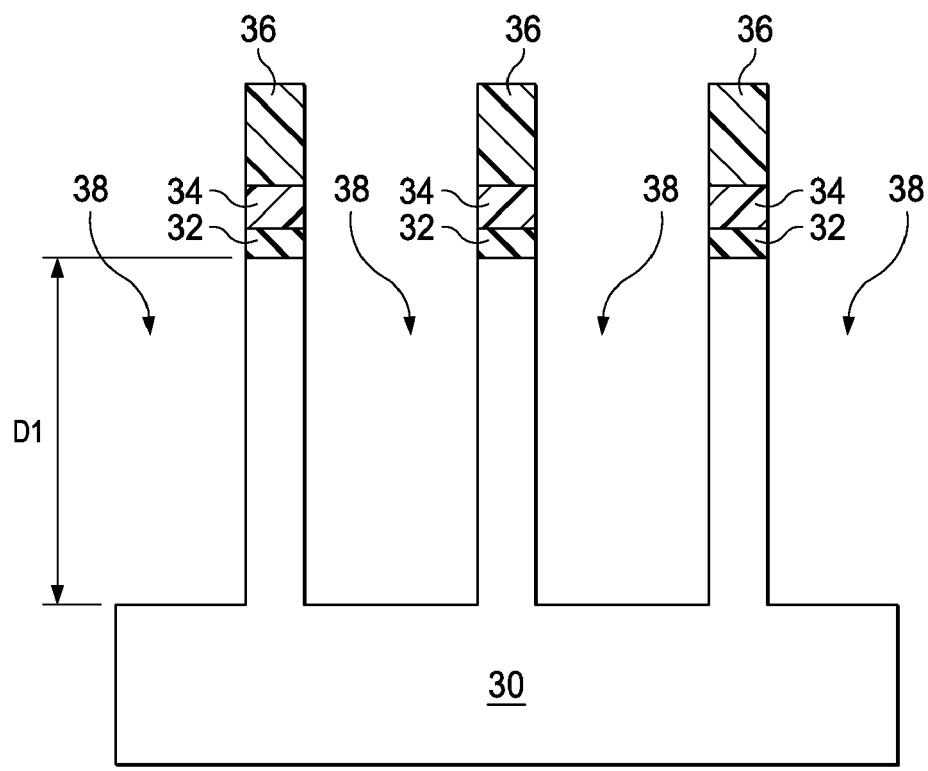

Referring to FIG. 2, photoresist 36 is applied on mask layer 34, and is then patterned, forming openings 38 in photoresist 36. Mask layer 34 and pad layer 32 are then etched through openings 38, exposing underlying semiconductor substrate 30. Next, semiconductor substrate 30 is etched, so that openings 38 extend into semiconductor substrate 30. In an exemplary embodiment, the recessing depth D1 of semiconductor substrate 30 is between about 100 nm and about 300 nm.

Figure 3:
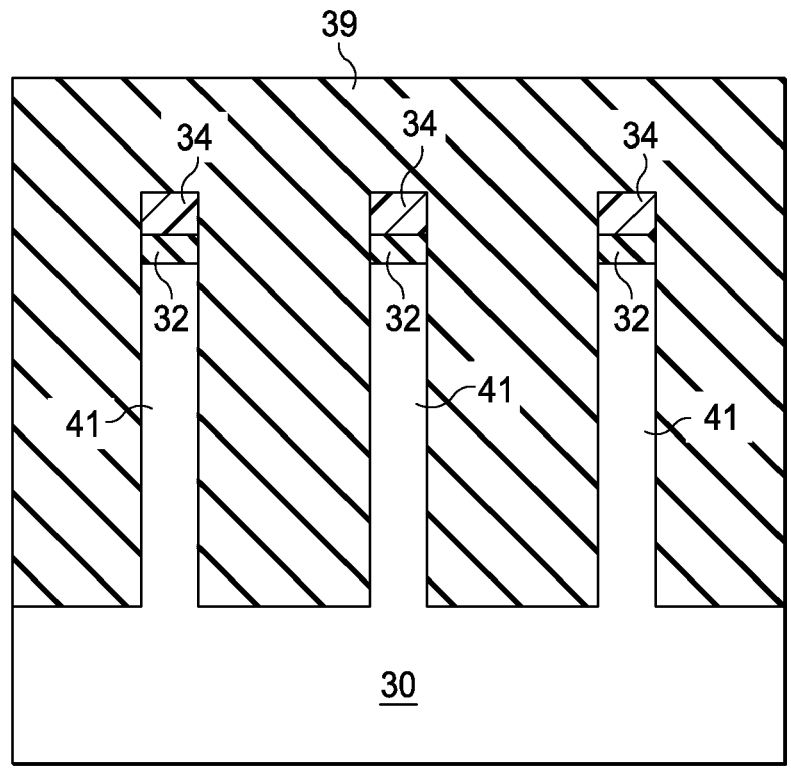
Figure 4:
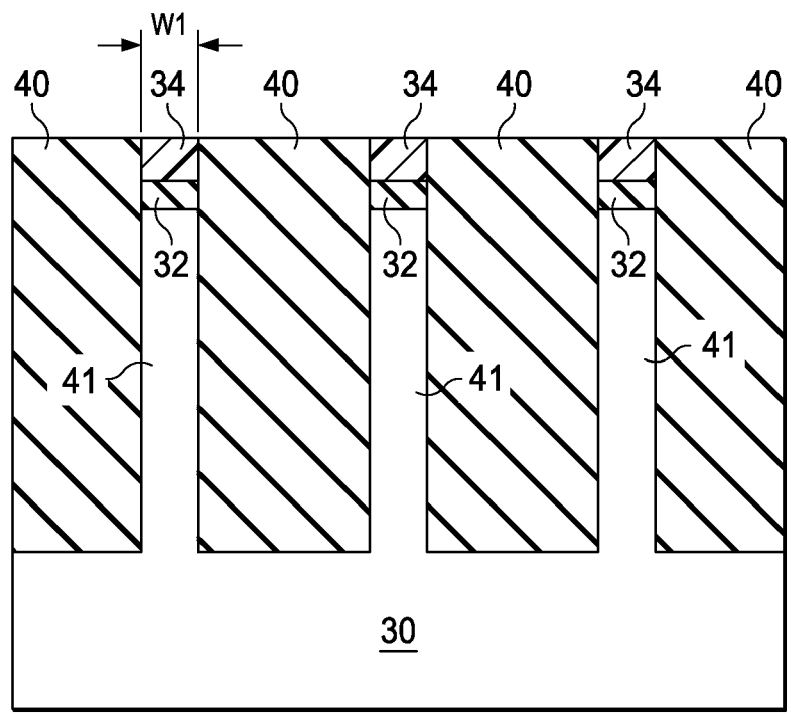

In an embodiment, as shown in FIG. 3, openings 38 are filled with dielectric material 39, for example, silicon oxide formed by sub-atmospheric chemical vapor deposition (SA-CVD). In other embodiments, dielectric layer 39 is formed by high-density plasma chemical vapor deposition (HDP-CVD) or spin on (with spin-on glass (SOG)). A chemical mechanical polish (CMP) is then performed to planarize the surface of the wafer, forming shallow trench isolation (STI) regions 40, and the resulting structure is shown in FIG. 4. Mask layer 34 may be used as a CMP stop layer. STI regions 40 define substrate portions 41 of silicon substrate 30 (refer to FIG. 3). Substrate portions 41 are also referred to extension portions of substrate 30 (with the portion of substrate 30 underlying STI regions 40 being treated as a substrate). In an exemplary embodiment, width W1 of substrate portion 41 is between about 5 nm and about 30 nm.

Figure 5:
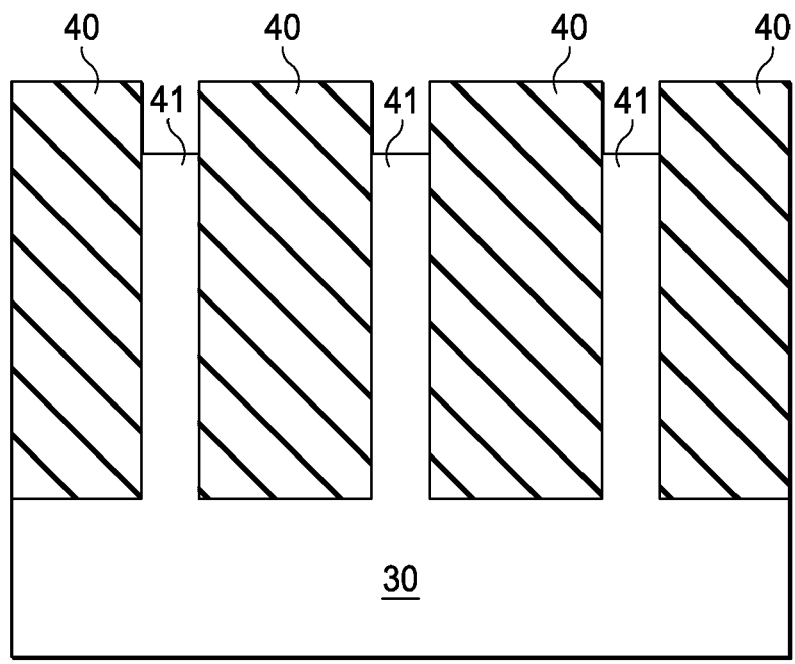
Figure 6:
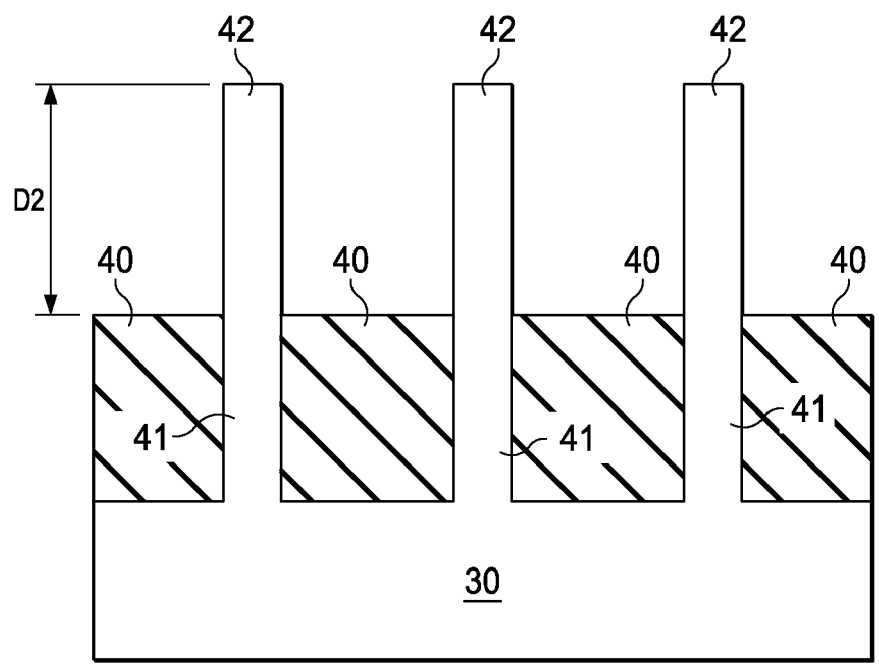

Referring to FIG. 5, the remaining portions of mask layer 34 and pad layer 32 are removed. Next, the exposed STI regions 40 are recessed and the resulting structure is shown in FIG. 6. As a result, top portions 42 of substrate extension portions 41 are above the top surface of remaining STI regions 40 to form fins 42. In an exemplary embodiment, the recessing depth D2 of the recesses is between about 20 nm and about 90 nm.

Figure 7:
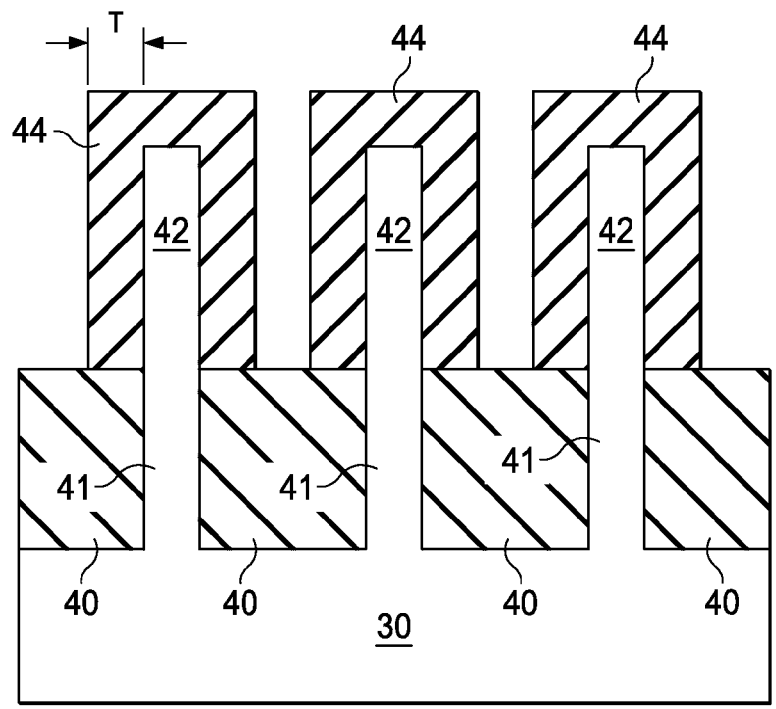

Referring to FIG. 7, silicon germanium (SiGe) layer 44 is selectively formed on fins 42, for example, through an epitaxial growth. The silicon germanium in SiGe layer 44 may be expressed as $Si_{1-x}Ge_x$, wherein x is the atomic percentage of germanium. In an exemplary embodiment, x is between about 0.15 and about 0.45. Thickness T of SiGe layer 44 may be between about 10 nm and about 30 nm.

Figure 8:
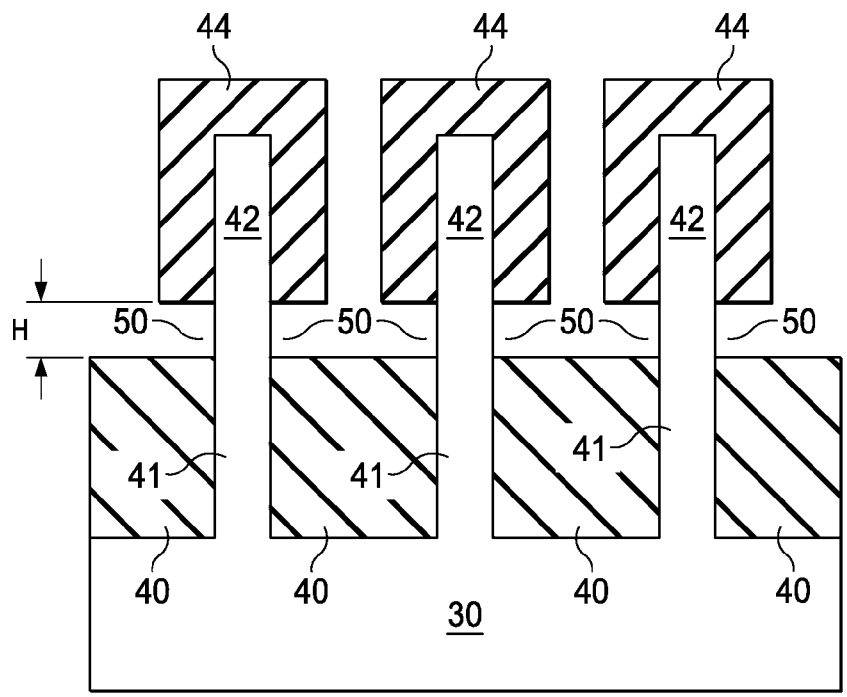

In an embodiment, referring to FIG. 8, an optional isotropic etch is performed using an etchant attacking STI regions 40, but not substrate portions 42/41 and SiGe layer 44. Accordingly, SiGe layer 44 acts as a mask. The resulting undercuts 50 extend under SiGe layer 44, and the sidewalls of substrate portions 41 are exposed. Height H of undercuts 50 may be between about 2 nm and about 5 nm, although a greater or a smaller height may also apply. In alternative embodiments, the step performed in FIG. 8 may be skipped, and no undercut is formed.

Figure 9A:
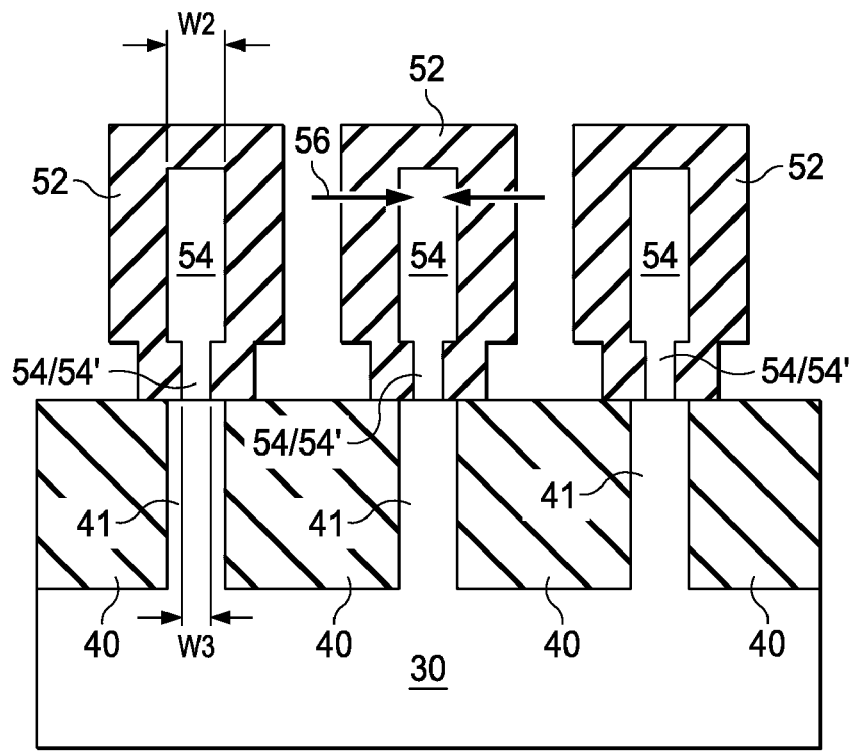
Figure 9B:
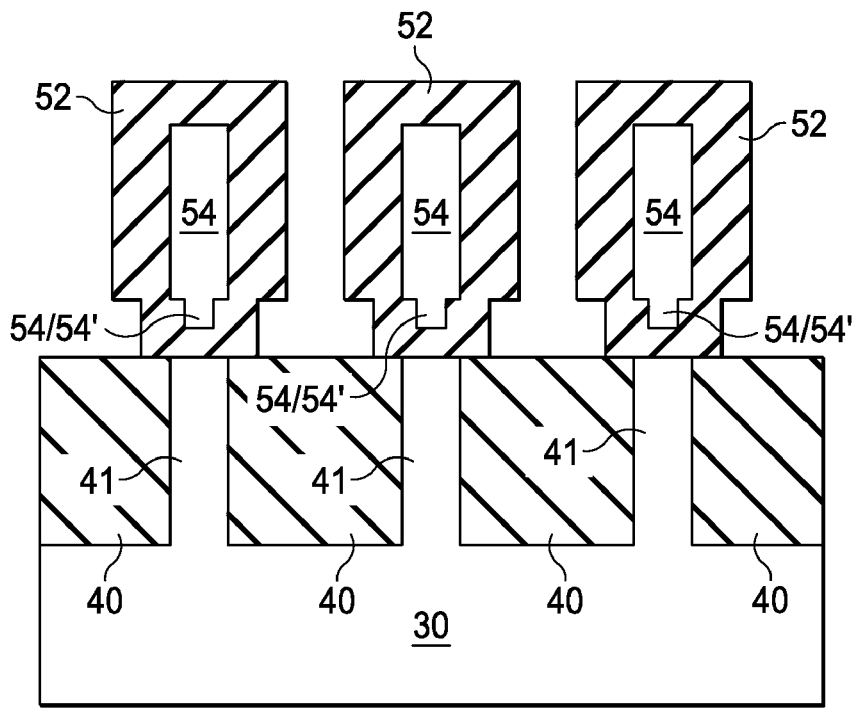

Referring to FIGS. 9A and 9B, a condensation step is performed. The condensation may be preformed at a temperature between about 850° C. and 1100° C. in an oxygen-containing environment (such as an oven), in which oxygen-containing gases, such as $O_2$, are introduced. The condensation results in the formation of silicon oxide layer 52 from the outer SiGe film due to the presence of oxygen. Germanium atoms in the SiGe film migrate inwardly to form SiGe fins 54. The silicon germanium in SiGe fins 54 may be expressed as $Si_{1-y}Ge_y$, wherein y is the atomic percentage of germanium. Germanium percentage y may be between about 20 and about 80 percent. In an exemplary embodiment, germanium percentage y may be close to 1, which means that SiGe fins 54 are formed of substantially pure germanium. With the condensation step being controlled, the germanium percentage y may be greater than the germanium percentage x in SiGe layer 44 (FIG. 7). This may be achieved, for example, by adjusting the thickness of SiGe layer 44 and the process conditions of the condensation. The germanium percentage y may be increased by increasing the thickness of SiGe layer 44 and increasing germanium percentage x in SiGe layer 44.

Due to the existence of undercuts 50 (refer to FIG. 8), SiGe fins 54 are bottom-notched and include neck regions 54' that are narrower than the upper portions of SiGe fins 54. In an embodiment, width W3 of silicon SiGe neck regions 54' may be less than about 50 percent, or even less than about 20 percent of the width W2 of a top portion of silicon SiGe fins 54. Further, width W3 may be less than about 5 nm. Alternatively, no neck region 54' exists (width W3 is equal to zero). Further, in neck regions 54', the atomic percentage of germanium decrease from top to bottom, and at some point, neck regions 54' merge with substrate portions 41. Further, as an effect of the migration of germanium atoms from outside to inside, in the upper portions of SiGe fins 54, for example, in the directions of arrows 56, the germanium percentage decreases, which means that the germanium percentages in outer portions of SiGe fins 54 may be higher than the germanium percentages in inner portions (including the center) of SiGe fins 54.

FIG. 9B illustrates an alternative embodiment, wherein close to undercut regions 50 (FIG. 8), the portions of silicon oxide layer 52 on opposite sides of neck regions 54' merge together, so that silicon oxide layer 52 extends directly underlying neck regions 54', and SiGe fins 54 are electrically insulated from the respective underlying substrate portions 41. With this embodiment, a uniform SiGe concentration fin can be formed. By completely shutting off the Ge downward diffusion path (with width W3 being 0) followed by a high temperature anneal, Ge atoms can be uniformly distributed inside the SiGe fin.

Figure 10:
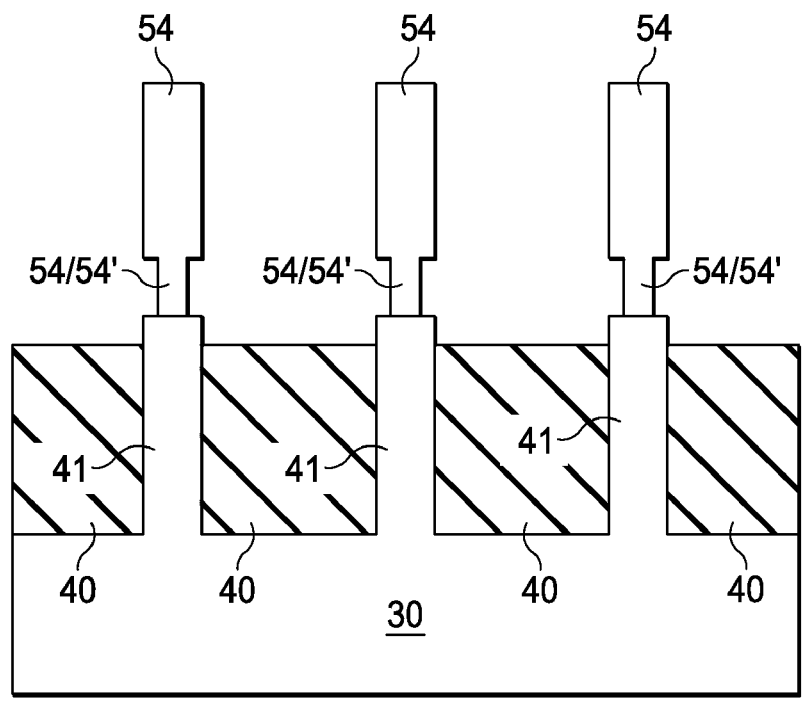
Figure 11A:
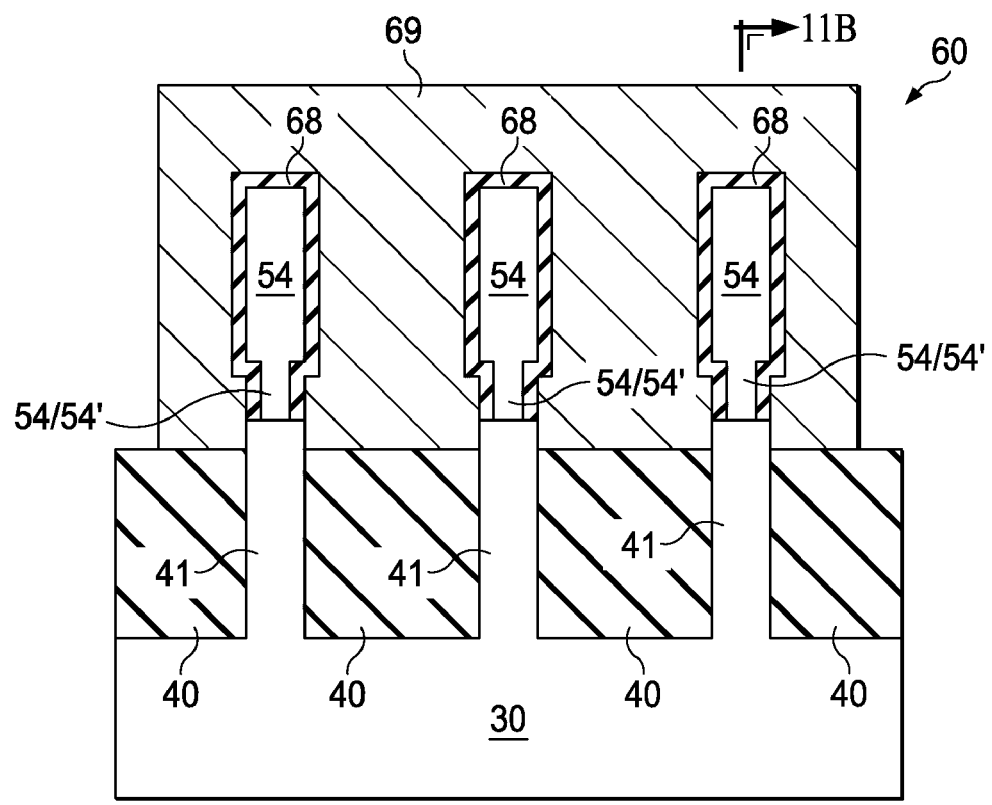
Figure 11B:
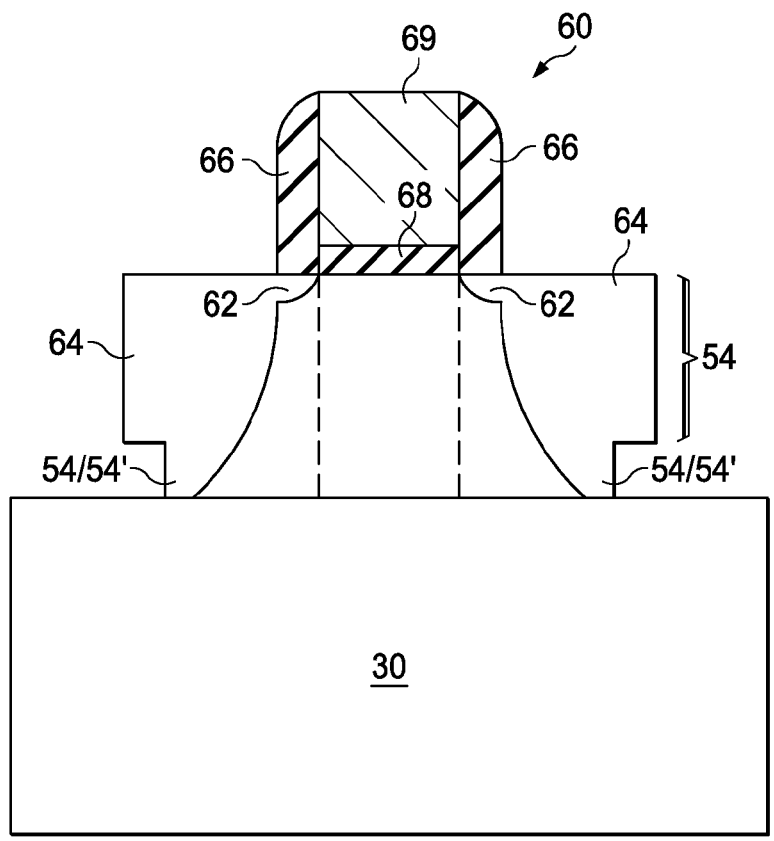

In FIG. 10, oxide layer 52 is removed, for example, by an isotropic etch, and the resulting structure is shown, in which SiGe fins 54 are exposed. Next, FinFET 60 may be formed based on SiGe fins 54, as is shown in FIGS. 11A and 11B. FIG. 11B illustrates a cross-sectional view taken from a plane crossing line 11B-11B in FIG. 11A. The resulting FinFET 60 may include lightly doped source and drain regions 62, source and drain regions 64, gate spacers 66, gate dielectric 68, and gate electrodes 69. Gate dielectric 68 may be formed of a high-k dielectric material, for example, with a k value greater than about 7. The processes for forming components 62, 64, 66, 68, and 69 are known in the art, and hence are not described herein.

FIGS. 12 through 15 illustrate cross-sectional views of intermediate stages in the manufacturing of another embodiment. Unless specified otherwise, the materials and formation details of the components in this embodiment are essentially the same as the like components, which are denoted by like reference numerals, in the embodiment shown in FIGS. 1 through 11B. The formation details of the embodiment shown in FIGS. 12 through 15 may thus be found in the discussion of the embodiment shown in FIGS. 1 through 11B. The initial steps of this embodiment are essentially the same as shown in FIGS. 1 through 9B.

Figure 12:
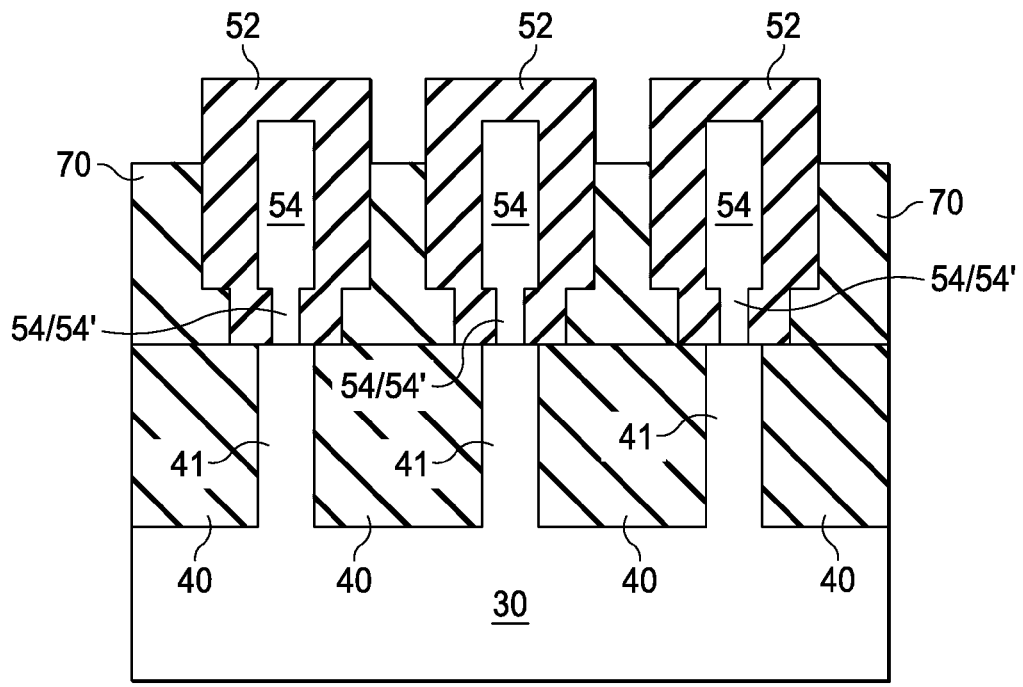
FIGS. 12 through 18 are cross-sectional views of intermediate stages in the manufacturing of a FinFET in accordance with alternative embodiments.

Next, referring to FIG. 12, sacrificial dielectric material 70 is filled into the gaps between (as shown in FIG. 9A) SiGe fins 54 and oxide layer 52. In an embodiment, high aspect ratio process (HARP) oxide is used to fill sacrificial dielectric material 70, although sacrificial dielectric material 70 may also be filled using other methods with a good gap-filling ability, such as spin-on, sub-atmospheric chemical vapor deposition (SA-CVD), and even high-density plasma CVD (HDP-CVD). In an embodiment, as shown in FIG. 12, the top surface of sacrificial dielectric material 70 is lower than the top surface of oxide layer 52. In alternative embodiments, the filling of dielectric material 70 is performed until the top surface of sacrificial dielectric material 70 is higher than the top surface of oxide layer 52. A CMP and/or an etch-back is then performed to lower the surface of sacrificial dielectric material 70 to form the structure as shown in FIG. 12. Sacrificial dielectric material 70 may have a high etching selectivity with oxide layer 52, so that oxide layer 52 remains unremoved.

Figure 13:
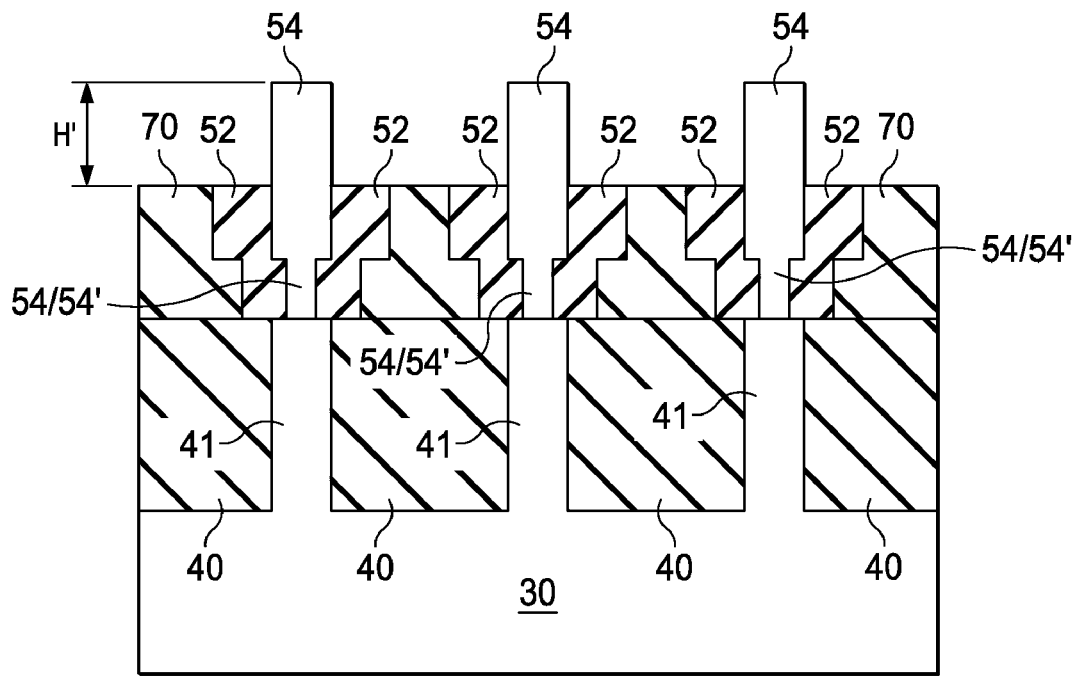
Figure 14:
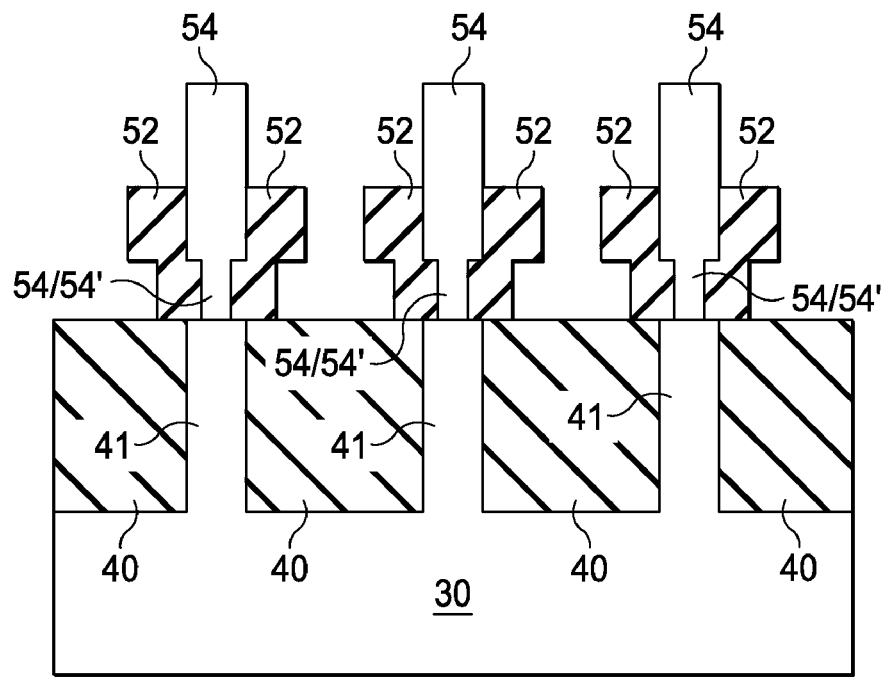

Referring to FIG. 13, the exposed upper portions of oxide layer 52 not protected by sacrificial dielectric material 70 are etched, and SiGe fins 54 are exposed. The height H' of SiGe fins 54 may be adjusted by adjusting the height of remaining lower portions of oxide layer 52. In FIG. 14, sacrificial dielectric material 70 is removed, for example, using an isotropic etch. In this embodiment, the lower portions of dielectric layer 52 remain to protect the sidewalls of lower portions of SiGe fins 54, so that SiGe fins 54 are less likely to be broken.

Figure 15:
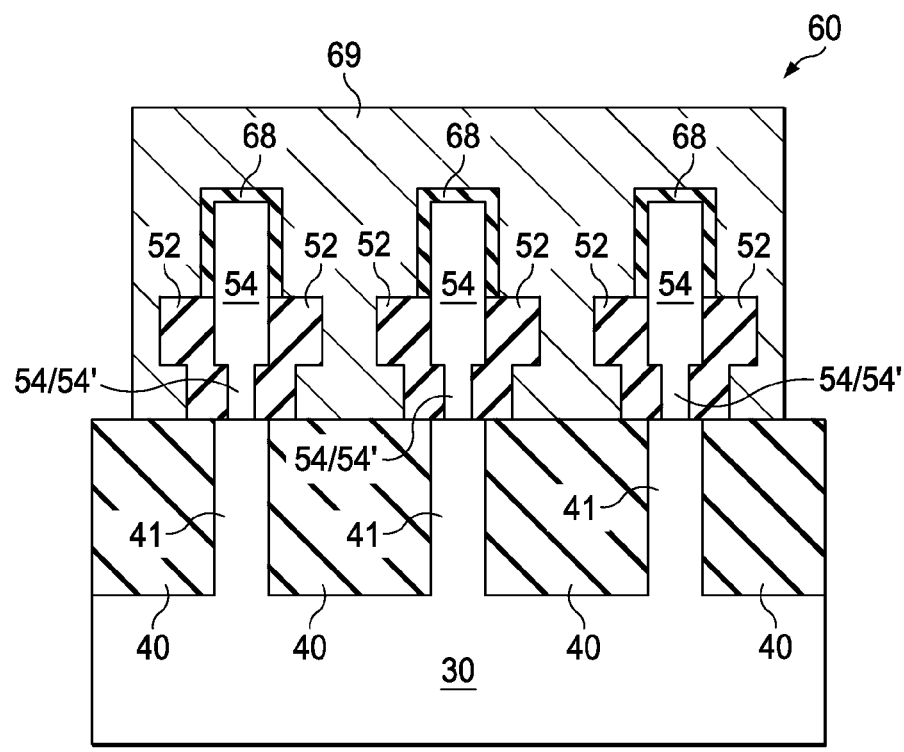

Next, as shown in the cross-sectional view of FIG. 15, Fin-FET 60 is formed based on SiGe fin(s) 54.

Figure 16:
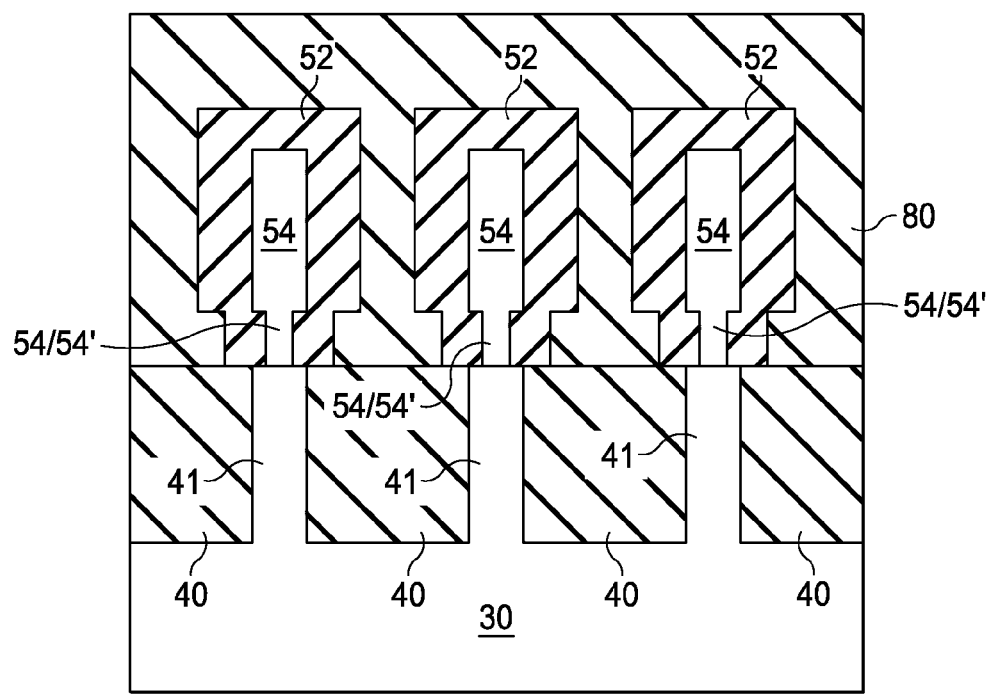
Figure 17:
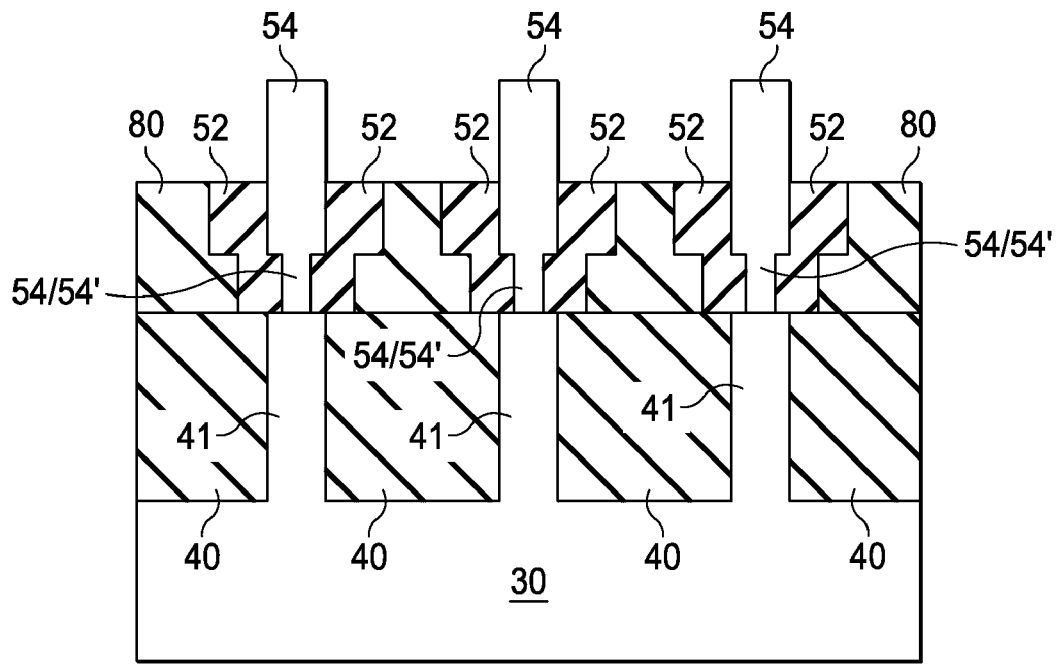
Figure 18:
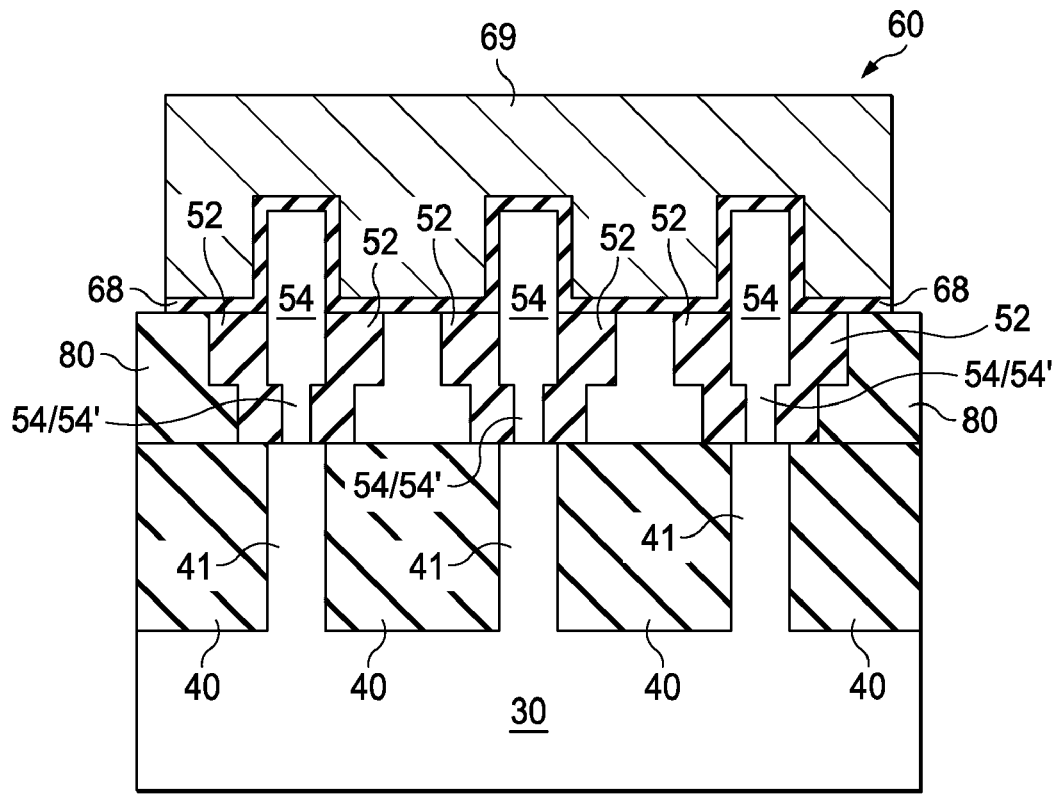

FIGS. 16 through 18 illustrate cross-sectional views of intermediate stages in the manufacturing of yet another embodiment. Again, unless specified otherwise, the materials and formation details of the components in this embodiment are essentially the same as the like components, which are denoted by like reference numerals in the embodiment shown in FIGS. 1 through 11B. Next, referring to FIG. 16, dielectric material 80 is filled into the gaps between SiGe fins 54 and oxide layer 52, until the top surface of dielectric material 80 is higher than the top surface of oxide layer 52. In an embodiment, spin-on is used to fill dielectric material into the gaps shown in FIG. 9A or 9B, although other methods having good gap-filling ability may also be used. A CMP is then performed to lower the surface of dielectric material 80. Dielectric material 80 may be formed of an oxide, such as silicon oxide, although other dielectric materials may also be used.

Referring to FIG. 17, a selective etch back is performed to recess oxide layer 52 and dielectric material 80, resulting in the structure as shown in FIG. 17. The recessing of oxide layer 52 and dielectric material 80 may be performed simultaneously. The top portions of SiGe fins 54 are thus exposed. The recessing depth may be adjusted to adjust the height of SiGe fins 54, which will be used to form FinFETs. Next, as shown in the cross-sectional view of FIG. 18, FinFET 60 is formed on SiGe fin(s) 54.

In the embodiments, with the condensation approach, the germanium percentage in SiGe fins may be freely tuned, and can be much higher than the as-deposited germanium concentration in the deposited SiGe films. Also, the dislocation defects in the condensed SiGe fins may also be reduced as compared to the defects in the SiGe formed by epitaxial growth.

The neck regions in the SiGe fins may significantly reduce, and possibly eliminate, the punch-through currents in the resulting FinFETs. As a result, the channel regions of the FinFETs do not require high impurity (well) concentrations, and the fin heights may be increased in order to increase the drive currents of the FinFETs without incurring the penalty of increased leakage currents.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An integrated circuit structure comprising:
   a substrate;
   a germanium-containing semiconductor fin over the substrate, wherein the germanium-containing semiconductor fin comprises an upper portion having a first width, and a neck region under the upper portion and having a second width smaller than the first width, and wherein the germanium-containing semiconductor fin has a different material composition than the substrate; and
   two insulation regions on opposite sides of the germanium-containing semiconductor fin, wherein top surfaces of the two insulation regions are lower than a bottom end of the neck region.

2. The integrated circuit structure of claim 1 further comprising an extension portion of the substrate between and adjoining the two insulation regions, wherein the extension portion is directly underlying the germanium-containing semiconductor fin.

3. The integrated circuit structure of claim 2, wherein a bottom end of the neck region adjoins the extension portion of the substrate.

4. The integrated circuit structure of claim 2 further comprising a silicon oxide region electrically insulating a bottom end of the neck region from the extension portion of the substrate.

5. The integrated circuit structure of claim 1 further comprising:
   a gate dielectric of a FinFET on a top surface and sidewalls of the germanium-containing semiconductor fin; and
   a gate electrode of the FinFET on the gate dielectric.

6. The integrated circuit structure of claim 1, wherein the substrate is a silicon substrate, and wherein the germanium-containing semiconductor fin comprises silicon germanium.

7. The integrated circuit structure of claim 1, wherein the germanium-containing semiconductor fin has a germanium atomic percentage higher than about 15 percent.

8. The integrated circuit structure of claim 1, wherein the second width is less than about 5 nm.

9. An integrated circuit structure comprising:
   a silicon substrate;
   a silicon germanium (SiGe) fin over the silicon substrate, wherein the SiGe fin comprises an upper portion having a first width, and a lower portion comprising a neck region having a second width smaller than the first width;
   two insulation regions on opposite sides of the SiGe fin;
   an extension portion of the silicon substrate between and adjoining the two insulation regions, wherein the extension portion is directly underlying the SiGe fin;
   a silicon oxide layer on sidewalls of the lower portion of the SiGe fin and not on sidewalls of the upper portion of the SiGe fin;
   a gate dielectric of a FinFET on a top surface and sidewalls of the SiGe fin, wherein the gate dielectric comprises a bottom end contacting a top end of the silicon oxide layer; and
   a gate electrode of the FinFET on the gate dielectric.

10. The integrated circuit structure of claim 9, wherein top surfaces of the insulation regions are lower than a bottom end of the neck region.

11. The integrated circuit structure of claim 9, wherein the SiGe fin has a germanium atomic percentage between about 20 percent and about 80 percent.

12. The integrated circuit structure of claim 9, wherein the second width is less than about 5 nm.

13. The integrated circuit structure of claim 9, wherein a bottom end of the neck region adjoins the extension portion of the silicon substrate.

14. The integrated circuit structure of claim 9 further comprising a silicon oxide region separating a bottom end of the neck region from the extension portion of the silicon substrate.

15. An integrated circuit structure comprising:
a silicon substrate; and
a silicon germanium (SiGe) fin over the silicon substrate, wherein a germanium atomic percentage of the SiGe fin decreases from an outside to an inside of the SiGe fin;
an oxide region electrically insulating a bottom end of the SiGe fin from the silicon substrate, and
two insulation regions in the silicon substrate, with a portion of the silicon substrate between and adjoining the two insulation regions, and wherein the SiGe fin is directly over the portion of the silicon substrate.

16. The integrated circuit structure of claim 15 wherein the oxide region further extends to sidewalls of the SiGe fin.

17. The integrated circuit structure of claim 16 further comprising a gate dielectric of a FinFET on a top surface and sidewalls of the SiGe fin, wherein the gate dielectric comprises a bottom end contacting a top end of the oxide region.

18. The integrated circuit structure of claim 15, wherein the SiGe fin comprises an upper portion having a first width, and a lower portion comprising a neck region having a second width smaller than the first width.

19. The integrated circuit structure of claim 15 further comprising a gate dielectric of a FinFET on a top surface, a bottom surface, and sidewalls of the SiGe fin.

* * * * *